United States Patent
Saegusa et al.

(10) Patent No.: US 12,512,302 B2
(45) Date of Patent: Dec. 30, 2025

(54) GAS TREATMENT APPARATUS

(71) Applicant: Tokyo Electron Limited, Tokyo (JP)

(72) Inventors: Yuji Saegusa, Nirasaki (JP); Tatsuya Handa, Nirasaki (JP); Reiko Sasahara, Nirasaki (JP); Kenshiro Asahi, Nirasaki (JP); Kazuaki Nishimura, Nirasaki (JP); Akihiro Yoshimura, Nirasaki (JP); Masaki Furusawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 705 days.

(21) Appl. No.: 17/686,609

(22) Filed: Mar. 4, 2022

(65) Prior Publication Data

US 2022/0301821 A1 Sep. 22, 2022

(30) Foreign Application Priority Data

Mar. 17, 2021 (JP) ................. 2021-043306

(51) Int. Cl.
*H01J 37/32* (2006.01)
*C23C 16/44* (2006.01)
*H01L 21/67* (2006.01)

(52) U.S. Cl.
CPC ...... *H01J 37/3244* (2013.01); *C23C 16/4404* (2013.01); *H01J 37/32477* (2013.01); *H01L 21/67069* (2013.01)

(58) Field of Classification Search
CPC .......... C23C 16/4404; C23C 16/45565; H01J 37/3244; H01J 37/32477; H01J 37/32495; H01J 2237/334; H01L 21/3065; H01L 21/31116; H01L 21/67017; H01L 21/67069

See application file for complete search history.

(56) References Cited

U.S. PATENT DOCUMENTS

| | | | |
|---|---|---|---|
| 5,728,260 A * | 3/1998 | Brown ................ | H01J 37/3244 156/345.33 |
| 2005/0109460 A1* | 5/2005 | DeDontney ....... | C23C 16/45565 156/345.33 |
| 2011/0035957 A1* | 2/2011 | Muraki ............. | H01L 21/67748 34/236 |

(Continued)

FOREIGN PATENT DOCUMENTS

| | | |
|---|---|---|
| CN | 101266924 A | 9/2008 |
| WO | 2013183437 A1 | 12/2013 |

*Primary Examiner* — Benjamin Kendall
(74) *Attorney, Agent, or Firm* — Nath, Goldberg & Meyer; Jerald L. Meyer

(57) ABSTRACT

There is provided a gas treatment apparatus for performing gas treatment on a substrate. The gas treatment apparatus includes: a chamber in which the substrate is accommodated; a gas supply mechanism configured to individually supply a fluorine-containing gas and an alkaline gas; and a gas introduction member configured to cause the fluorine-containing gas and the alkaline gas supplied from the gas supply mechanism to merge with each other and introduce a mixed gas in which the fluorine-containing gas and the alkaline gas are mixed into the chamber. A portion of the gas introduction member including a merging point of the fluorine-containing gas and the alkaline gas is made of an aluminum-based material. A resin coating is formed on at least the portion including the merging point.

7 Claims, 7 Drawing Sheets

(56) References Cited

U.S. PATENT DOCUMENTS

| | | |
|---|---|---|
| 2014/0090599 A1* | 4/2014 | Saitou .................... B05B 1/005 |
| | | 118/728 |
| 2015/0357187 A1* | 12/2015 | Morimoto ......... H01L 21/76892 |
| | | 438/4 |
| 2015/0380218 A1 | 12/2015 | Tan et al. |
| 2016/0005621 A1* | 1/2016 | Toda ................. H01L 21/67109 |
| | | 156/345.24 |
| 2016/0247690 A1 | 8/2016 | Takahashi et al. |
| 2019/0024234 A1* | 1/2019 | Kamio .............. C23C 16/45565 |
| 2019/0169444 A1* | 6/2019 | Gangakhedkar ...... C23C 16/405 |
| 2020/0185202 A1 | 6/2020 | Widlow et al. |

* cited by examiner

GAS TREATMENT APPARATUS

CROSS-REFERENCE TO RELATED APPLICATION

This application is based upon and claims the benefit of priority from Japanese Patent Application No. 2021-043306, filed on Mar. 17, 2021, the entire contents of which are incorporated herein by reference.

TECHNICAL FIELD

The present disclosure relates to a gas treatment apparatus.

BACKGROUND

Recently, there is known a method called a chemical oxide removal (COR) process in which etching is performed chemically without generating plasma in a chamber in the process of manufacturing a semiconductor device. As COR, there is known a technique of processing a substrate by supplying hydrogen fluoride (HF) gas, which is a fluorine-containing gas, and ammonia ($NH_3$) gas, which is an alkaline gas, to the substrate via a shower head (see, for example, Patent Document 1).

PRIOR ART DOCUMENT

Patent Document

Patent Document 1: International Publication No. WO 2013/183437

SUMMARY

According to one embodiment of the present disclosure, there is provided a gas treatment apparatus for performing gas treatment on a substrate. The gas treatment apparatus includes: a chamber in which the substrate is accommodated; a gas supply mechanism configured to individually supply a fluorine-containing gas and an alkaline gas; and a gas introduction member configured to cause the fluorine-containing gas and the alkaline gas supplied from the gas supply mechanism to merge with each other and introduce a mixed gas in which the fluorine-containing gas and the alkaline gas are mixed into the chamber, wherein a portion of the gas introduction member including a merging point of the fluorine-containing gas and the alkaline gas is made of an aluminum-based material, and wherein a resin coating is formed on at least the portion including the merging point.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

[Overall Configuration of Gas Treatment Apparatus]

Figure 1:
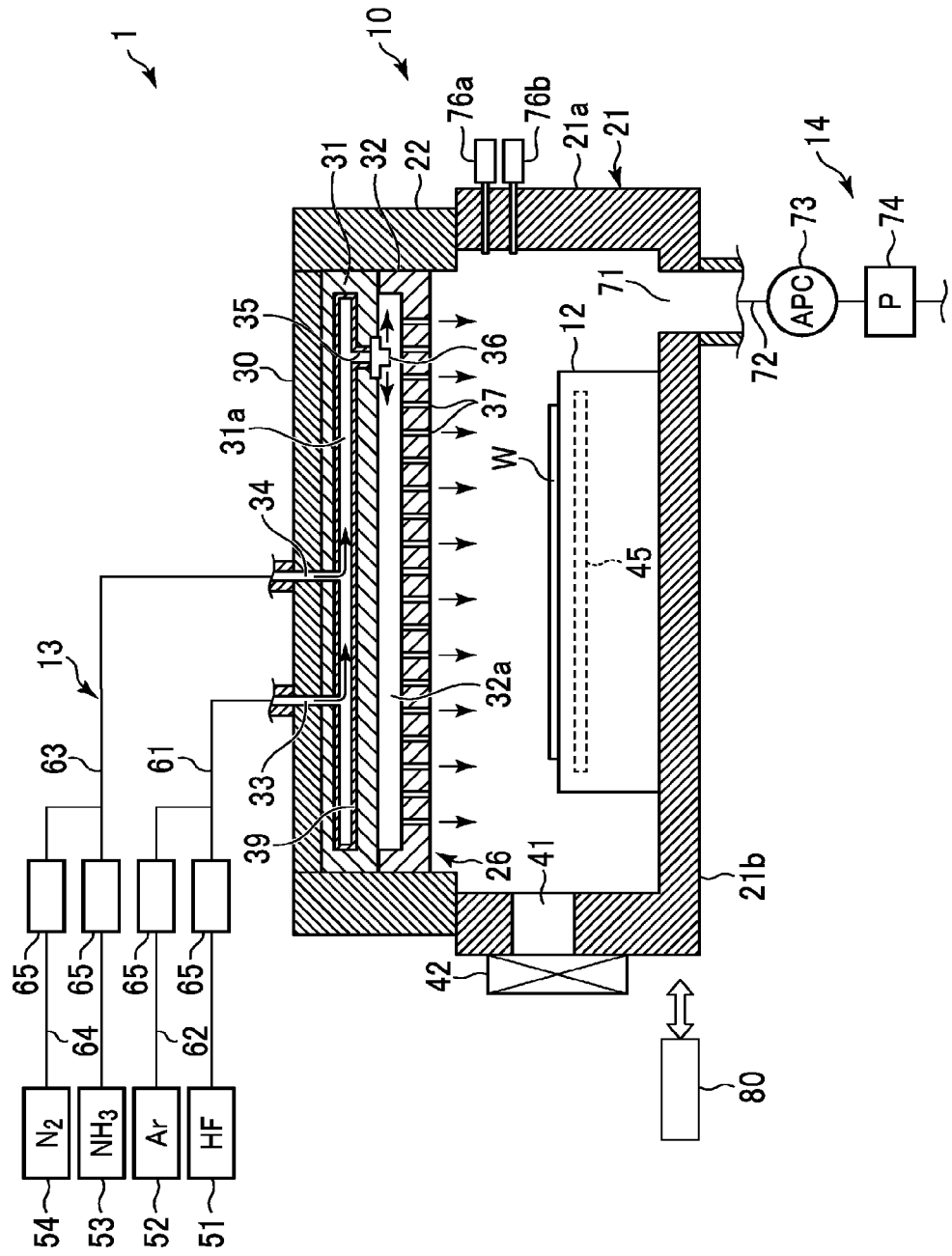
FIG. 1 is a cross-sectional view illustrating a gas treatment apparatus according to a first embodiment.

FIG. 1 is a cross-sectional view illustrating a gas treatment apparatus according to the first embodiment. The gas treatment apparatus illustrated in FIG. 1 is configured as an etching apparatus for etching a silicon oxide-based material existing on, for example, the surface of a substrate. As the silicon oxide-based material, $SiO_2$ may be mentioned as a typical example, but any material containing silicon and oxygen, such as SiOCN, may be used. In addition, the silicon oxide-based material is typically a film.

As illustrated in FIG. 1, the gas treatment apparatus 1 includes a chamber 10 having a sealed structure, and a stage 12 on which a substrate W is placed in a substantially horizontal state is provided inside the chamber 10. Examples of the substrate W include a semiconductor wafer such as a Si wafer, but the substrate W is not limited thereto.

In addition, the gas treatment apparatus 1 includes a gas supply mechanism 13 configured to supply an etching gas to the chamber 10 and an exhaust mechanism 14 configured to evacuate the interior of the chamber 10.

The chamber 10 includes a chamber main body 21 and a lid 22. The chamber main body 21 has a substantially cylindrical side wall portion 21a and a bottom portion 21b, and has an opening in the upper portion thereof that is closed by the lid 22 having a recess therein. The side wall portion 21a and the lid 22 are sealed by a sealing member (not illustrated) so as to ensure the airtightness of the interior of the chamber 10.

A shower head 26, which is a gas introduction member, is fitted inside the lid 22 to face the stage 12. The shower head 26 ejects gas into the chamber 10 in a shower form. The details of the shower head 26 will be described later.

The side wall portion 21a of the chamber main body 21 is provided with a carry-in/out port 41 for carrying in/out a substrate W therethrough, and this carry-in/out port 41 can be opened/closed by a gate valve 42 so that the substrate W can be transport to/from another adjacent module.

The stage 12 has a substantially circular shape in a plan view, and is fixed to the bottom portion 21b of the chamber 10. A temperature controller 45 is provided inside the stage 12 so as to adjust the temperature of the stage 12. The temperature controller 45 may include, for example, a temperature control medium flow path in which a temperature control medium (e.g., water) for temperature control circulates, or a resistance heater. The temperature controller 45 adjusts the temperature of the stage 12 to a desired temperature, whereby the temperature of the substrate W placed on the stage 12 is controlled.

The gas supply mechanism 13 includes an HF gas source 51, an Ar gas source 52, an $NH_3$ gas source 53, and a $N_2$ gas source 54.

The HF gas source 51 supplies HF gas as a fluorine-containing gas. Here, HF gas is exemplified as the fluorine-containing gas, but as the fluorine-containing gas, $F_2$ gas, $ClF_3$ gas, and $NF_3$ gas may also be used in addition to HF gas.

The $NH_3$ gas source supplies $NH_3$ gas as an alkaline gas. Here, $NH_3$ gas is exemplified as the alkaline gas, but as the alkaline gas, an amine gas may be used in addition to the $NH_3$ gas. Examples of the amine include methylamine, dimethylamine, trimethylamine and the like.

The Ar gas source 52 and the $N_2$ gas source 54 supply $N_2$ gas and Ar gas as inert gases having functions as a dilution gas, a purge gas, and a carrier gas. However, both may be Ar gas or $N_2$ gas. The inert gas is not limited to Ar gas and $N_2$ gas, and other rare gases such as He gas may also be used.

One ends of first to fourth gas supply pipes 61 to 64 are connected to these gas sources 51 to 54, respectively. The other ends of the first gas supply pipe 61 connected to the HF gas source 51 and the third gas supply pipe 63 connected to the $NH_3$ gas source 53 are connected to the shower head 26. The other end of the second gas supply pipe 62 connected to the Ar gas source 52 is connected to the first gas supply pipe 61. The other end of the fourth gas supply pipe 64 connected to the $N_2$ gas source 54 is connected to the third gas supply pipe 63.

HF gas as the fluorine-containing gas and $NH_3$ gas as the alkaline gas are introduced into the shower head 26 together with Ar gas and $N_2$ gas as the inert gases, respectively.

The first to fourth gas supply pipes 61 to 64 are each provided with a flow rate controller 65 configured to perform an opening/closing operation of the flow path and flow rate control. The flow rate controller 65 is configured with, for example, an opening/closing valve and a flow rate controller such as a mass flow controller (MFC) or a flow control system (FCS).

The exhaust mechanism 14 includes an exhaust pipe 72 connected to an exhaust port 71 formed in the bottom portion 21b of the chamber 10, and further includes an automatic pressure control valve (APC) 73 provided in the exhaust pipe 72 to control the pressure in the chamber 10 and a vacuum pump 74 configured to evacuate the interior of the chamber 10.

Two capacitance manometers 76a and 76b, one for high pressure and one for low pressure, are provided on the side wall of the chamber 10 for pressure control in the chamber 10. In the vicinity of the substrate W placed on the stage 12, a temperature sensor (not illustrated) is provided to detect the temperature of the substrate W.

The chamber 10 and the stage 12 constituting the gas treatment apparatus 1 may be made of an aluminum-based material. As the aluminum-based material, only aluminum or an aluminum alloy may be used, or an anodized film ($Al_2O_3$) may be formed on the surface of aluminum.

The gas treatment apparatus 1 further includes a controller 80. The controller 80 is configured with a computer, and includes a main controller including a CPU, an input device, an output device, a display device, and a storage device (a storage medium). The main controller controls the operation of each component of the gas treatment apparatus 1. The control of each component by the main controller is performed based on a control program stored in the storage medium (a non-transient computer readable memory such as a hard disk, an optical desk, a semiconductor memory, or the like) built in the storage device. A processing recipe is stored in the storage medium as a control program, and the gas treatment apparatus 1 executes a process based on the processing recipe.

The gas treatment apparatus of FIG. 1 may include a plasma source. Reactivity can be enhanced by exciting a gas with the plasma source, and depending on a gas to be used, it may be better to use plasma.

[Shower Head]

Next, the shower head 26 will be described. The shower head 26 includes an upper plate 30 constituting the upper wall of the lid 22, an intermediate plate 31 on the lower side of the upper plate 30, and a lower plate 32 on the lower side of the intermediate plate 31. These plates constitute the main body. The upper plate 30, the intermediate plate 31, and the lower plate 32 are made of the same aluminum-based material as the chamber 10 and the stage 12, and the shower head 26 is sealed by a seal ring (not illustrated) to form a sealed structure. A gas flow path 31a is formed in the central portion of the intermediate plate 31.

A first gas introduction hole 33 and a second gas introduction hole 34 are vertically formed to penetrate the upper portions of the upper plate 30 and the intermediate plate 31, and the first gas introduction hole 33 and the second gas introduction hole 34 are connected to the gas flow path 31a. The first gas supply pipe 61 connected to the HF gas source 51 is connected to the first gas introduction hole 33, and the third gas supply pipe 63 connected to the $NH_3$ gas source 53 is connected to the second gas introduction hole 34. Therefore, the HF gas as the fluorine-containing gas and the $NH_3$ gas as the alkaline gas merge and are mixed in the gas flow path 31a. A resin coating 39 is formed on the inner surface of the gas flow path 31a in the intermediate plate 31.

A recess 32a, which is a gas diffusion space, is formed on the top surface side of the lower plate 32. In addition, on the bottom surface side of the lower plate 32, gas ejection holes 37 are formed to extend vertically from the recess 32a and penetrate into the chamber 10 to face the interior of the chamber 10. The intermediate plate 31 is provided with connection holes 35 (only one is illustrated in FIG. 1) connecting the gas flow path 31a to the recess 32a serving as the gas diffusion space, and a gas injection plug 36 made of a resin is installed to a portion of the bottom surface of the intermediate plate 31 corresponding to each connection hole 35.

Figure 2:
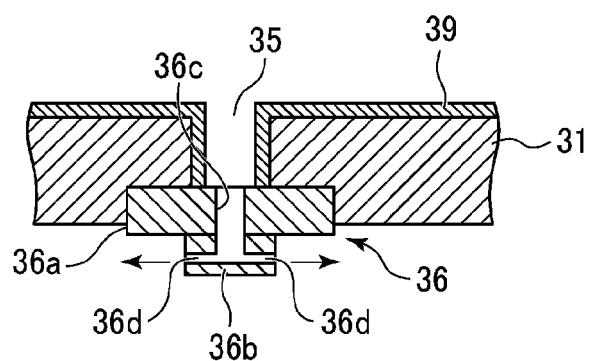
FIG. 2 is a cross-sectional view for describing the structure of a gas injection plug.

As illustrated in FIG. 2, the gas injection plug 36 includes a flange portion 36a installed to the intermediate plate 31 and a gas injection portion 36b protruding downward from the center of the lower portion of the flange portion 36a. A vertical hole 36c communicating with the connection hole 35 is formed in the center of the flange portion 36a. The vertical hole 36c communicates halfway through the gas injection portion 36b, and gas injection holes 36d extending from the vertical hole 36c are opened on the side surface of the gas injection portion 36b. A mixed gas of the fluorine-containing gas (HF gas) and the alkaline gas (NH$_3$ gas) is ejected from the gas injection hole 36d into the recess 32a which is a gas diffusion space. The mixed gas diffused in the recess 32a is ejected into the chamber 10 from the gas ejection holes 37.

[Resin Coating]

Next, the resin coating 39 will be described.

As described above, the resin coating 39 is formed on the inner surface of the gas flow path 31a in the intermediate plate 31 of the shower head 26. By providing the resin coating 39, when the HF gas as the fluorine-containing gas and the NH$_3$ gas as the alkaline gas merge in the gas flow path 31a, it is possible to prevent the gases from coming into contact with the aluminum-based material constituting the shower head 26. As a result, it is possible to effectively prevent the generation of particles due to the reaction between the mixed gas of the HF gas as the fluorine-containing gas and the NH$_3$ gas as the alkaline gas and the aluminum-based material.

As the resin coating 39, for example, a PFA coating using PFA which is a fluororesin may be preferably used. There are various types of PFA coatings, to some of which mica is added. However, mica contains many impurities such as Al and S, which are highly likely to cause particles. Therefore, the PFA coating preferably does not contain mica.

The resin coating 39 may be formed through powder coating, dip coating, or spray coating, and may have a thickness of about 40 μm to 1.0 mm. As the resin coating 39, a fluororesin other than PFA, for example, PTFE, PCTFE, FEP, ETFE, or PCTFE, may be used.

The reaction of the HF gas as the fluorine-containing gas and NH$_3$ gas as the alkaline gas with Al occurs frequently at a merging point of these gases. Therefore, the above reaction can be suppressed by forming the resin coating 39 on at least a portion including the merging point of these gases. The above-mentioned reaction also occurs in the flow path of the mixed gas in which the fluorine-containing gas and the base gas are mixed after merging. Therefore, in the present embodiment, the resin coating 39 is formed on the inner surface portion of the gas flow path 31a which includes the merging point of the HF gas as the fluorine-containing gas and the NH$_3$ gas as the alkaline gas and comes into frequent contact with the mixed gas of these gases.

Figure 3:
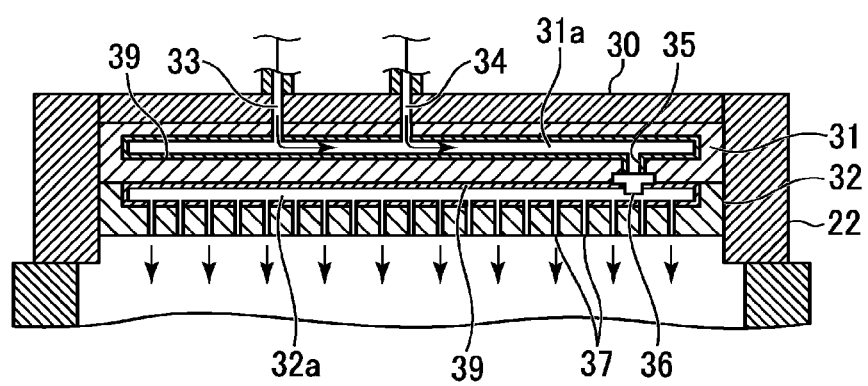
FIG. 3 is a cross-sectional view illustrating a state in which a resin coating is also formed on the inner surface of a recess, which is a gas diffusion space formed in a lower plate of a shower head, in the gas treatment apparatus according to the first embodiment.

In an aluminum-based material portion with which the mixed gas of the HF gas as the fluorine-containing gas and the NH$_3$ gas as the alkaline gas comes into contact, it is possible to obtain the effect of preventing the reaction by forming a resin coating even when the portion is a portion other than the inner surface portion of the gas flow path 31a of the intermediate plate 31. For example, as illustrated in FIG. 3, a resin coating may be formed on the inner surface portion of the recess 32a. However, since the inner surface portion of the recess 32a has a complicated shape including a portion corresponding to the gas ejection holes 37, it may be difficult to form a resin coating.

Figure 4:
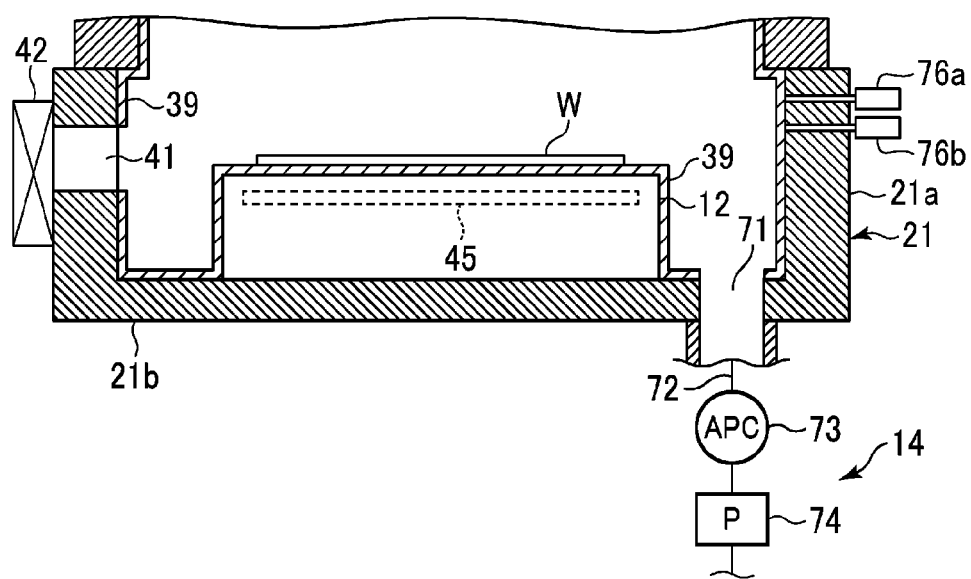
FIG. 4 is a cross-sectional view illustrating a state in which a resin coating is formed on the inner surface of the chamber and the surface of a stage in the gas treatment apparatus according to the first embodiment.

In addition, as illustrated in FIG. 4, the resin coating 39 may be formed not only on the shower head 26, but also on the inner surface of the chamber 10, which is another aluminum material portion in which the mixed gas of the fluorine-containing gas (HF gas) and the alkaline gas (NH$_3$ gas) comes into contact with each other. Since the fluorine-containing gas (HF gas) and the alkaline gas (NH$_3$ gas) come into contact with the stage 12, the resin coating may formed on the stage 12 when the stage 12 is made of an aluminum-based material.

[Operation of Gas Treatment Apparatus]

Next, the operation of the gas treatment apparatus 1 configured as described above will be described.

First, a substrate W is provided in the chamber 10. Specifically, the substrate W is carried into the chamber 10 and placed on the stage 12, the temperature of which is controlled by the temperature controller 45. As the substrate W, for example, a substrate having a silicon oxide-based film as an etching target film on the surface thereof is used.

Next, HF gas as a fluorine-containing gas and NH$_3$ gas as an alkaline gas are supplied into the chamber 10 as described below to perform gas treatment on the substrate W.

First, inert gases (Ar gas and N$_2$ gas) are supplied from the gas supply mechanism 13 into the chamber 10 via the shower head 26 to stabilize the temperature of the substrate W as well as to stabilize the pressure in the chamber 10. Next, the gas treatment is performed with the fluorine-containing gas and the alkaline gas in a state in which the inert gases are supplied from the gas supply mechanism 13. For example, HF gas is used as the fluorine-containing gas, and NH$_3$ gas is used as the alkaline gas to etch the silicon oxide-based material on the surface of the substrate W, for example, a SiO$_2$ film. In this case, the fluorine-containing gas is supplied to the gas flow path 31a of the shower head 26 through the first gas supply pipe 61 and the first gas introduction hole 33, and the alkaline gas is supplied to the gas flow path 31a through the third gas supply pipe 63 and the second gas introduction hole 34. As a result, the fluorine-containing gas (HF gas) and the alkaline gas (NH$_3$ gas) merge with each other in the gas flow path 31a of the shower head 26 and are mixed (premixed) before being supplied to the chamber 10. Then, the mixed gas thus mixed reaches the recess 32a via the connection hole 35 and the gas injection plug 36, and is ejected from the gas ejection holes 37 into the chamber 10.

In this gas treatment, cycle etching may be performed in which a period for supplying the fluorine-containing gas (HF gas) and the alkaline gas (NH$_3$ gas) into the chamber 10 and a purge period for purging the interior of the chamber 10 are repeated plural times.

Purging in the chamber 10 is performed by evacuating the interior of the chamber 10 in the state in which gas supply is stopped, supplying an inert gas while stopping the supply of the fluorine-containing gas (HF gas) and the alkaline gas (NH$_3$ gas), or performing both of these.

When HF gas is used as the fluorine-containing gas and NH$_3$ gas is used as the alkaline gas, ammonium silicate is formed as a reaction product on the surface of the substrate W during the period of supplying these gases, and the ammonium silicate is removed during the purge period.

After the etching is completed, the inert gas is supplied into the chamber 10 to purge the interior of the chamber 10. Then, the gate valve 42 is opened, and the substrate W is carried out from the carry-in/out port 41.

It was found that, when such gas treatment with HF gas and NH$_3$ gas is performed using a gas treatment apparatus in the related arts, the HF gas and the NH$_3$ gas react with the Al of the shower head under the presence of water (H$_2$O) at the merging point of the HF gas and the NH$_3$ gas in the shower head 26. In addition, it was found that AlF-based particles such as AlF$_x$ or AlO$_x$F$_y$ are generated by such a reaction. It is considered that similar AlF-based particles are generated when other fluorine-containing gas and basic gas are used.

The following formulas (1) to (3) are exemplified as a reaction model at this time.

$$HF + NH_3 \rightarrow NH_4F \tag{1}$$

$$2(NH_4)F + H_2O \rightarrow NH_3 + HF^-_2 + NH^+_4 + H_2O \tag{2}$$

$$Al_2O_3 + 2HF^-_2 \rightarrow 2AlF_x + H_2O(g) + O_2 \tag{3}$$

Therefore, by suppressing these reactions, it is possible to suppress the generation of AlF-based particles such as $AlF_x$ and $AlO_xF_y$.

Therefore, in the present embodiment, a resin coating 39 is formed on at least a portion of the shower head 26 made of an aluminum-based material, including a merging point at which the fluorine-containing gas (HF gas) and the alkaline gas ($NH_3$ gas) merge with each other. This prevents the fluorine-containing gas (HF gas) and the alkaline gas ($NH_3$ gas) from coming into direct contact with the aluminum-based material portion. Therefore, the above-mentioned reactions (1) to (3) are suppressed so that the generation of AlF-based particles such as $AlF_x$ and $AlO_xF_y$ can be suppressed very effectively.

These reactions also occur in the flow path of the mixed gas in which the fluorine-containing gas and the base gas are mixed after merging. Therefore, in the present embodiment, the resin coating 39 is formed on the inner surface portion of the gas flow path 31a which includes the merging point of the HF gas as the fluorine-containing gas and the $NH_3$ gas as the alkaline gas and comes into frequent contact with the mixed gas of these gases. As a result, the generation of particles can be suppressed more effectively, and thus the life of the intermediate plate can be extended.

In addition, the mixed gas of the fluorine-containing gas (HF gas) and the alkaline gas ($NH_3$ gas) also comes into contact with the inner surface portion of the recess 32a. Therefore, as illustrated in FIG. 3, by forming the resin coating 39 on the inner surface portion of the recess 32a as well, the effect of suppressing the generation of particles can be further enhanced. However, the need for the resin coating 39 is higher in the gas flow path 31a than in the recess 32a. That is, since the higher the $NH_3$ gas concentration and the higher the pressure, the more likely it is for the reactions (1) to (3) to proceed, the need for the resin coating 39 is higher in the gas flow path 31a, in which the $NH_3$ comes into contact with the wall surface at a high concentration and the pressure is high due to a narrow gas flow region, than in the recess 32a. Regarding the gas ratio, when the ratio of the $NH_3$ gas is $HF:NH_3=6.5:1$ or more, the above-mentioned reactions are likely to occur at the merging point or the like, and the resin coating 39 becomes more effective.

Although not as much as the shower head 26, the mixed gas of the HF gas as the fluorine-containing gas and the alkaline gas also comes into contact with the inner surface of the chamber 10. Such a mixed gas also comes into contact with the stage 12. Therefore, as illustrated in FIG. 4, by forming the resin coating 39 on the inner surface of the chamber 10 and the stage 12, the effect of suppressing the generation of particles can be further enhanced.

As the resin coating 39, a PFA coating using PFA which is a fluororesin may be preferably used, and a resin coating 39 which does not contain mica which causes particles is more preferable. Furthermore, when the gas injection plug 36 is made of the PFA as well, the effect of suppressing the generation of particles can be enhanced.

Second Embodiment

Figure 5:
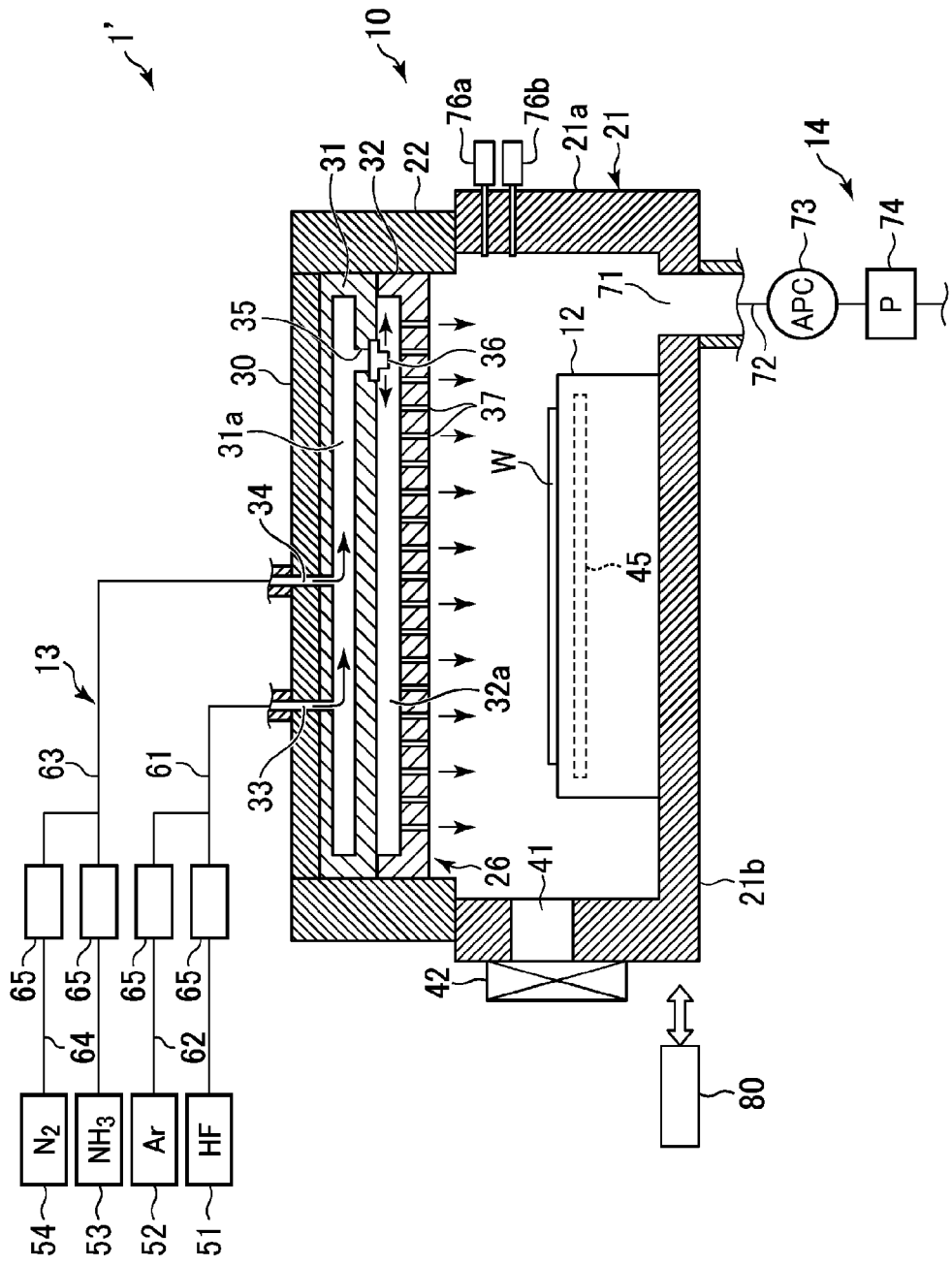
FIG. 5 is a cross-sectional view illustrating a gas treatment apparatus according to a second embodiment.
Figure 6:
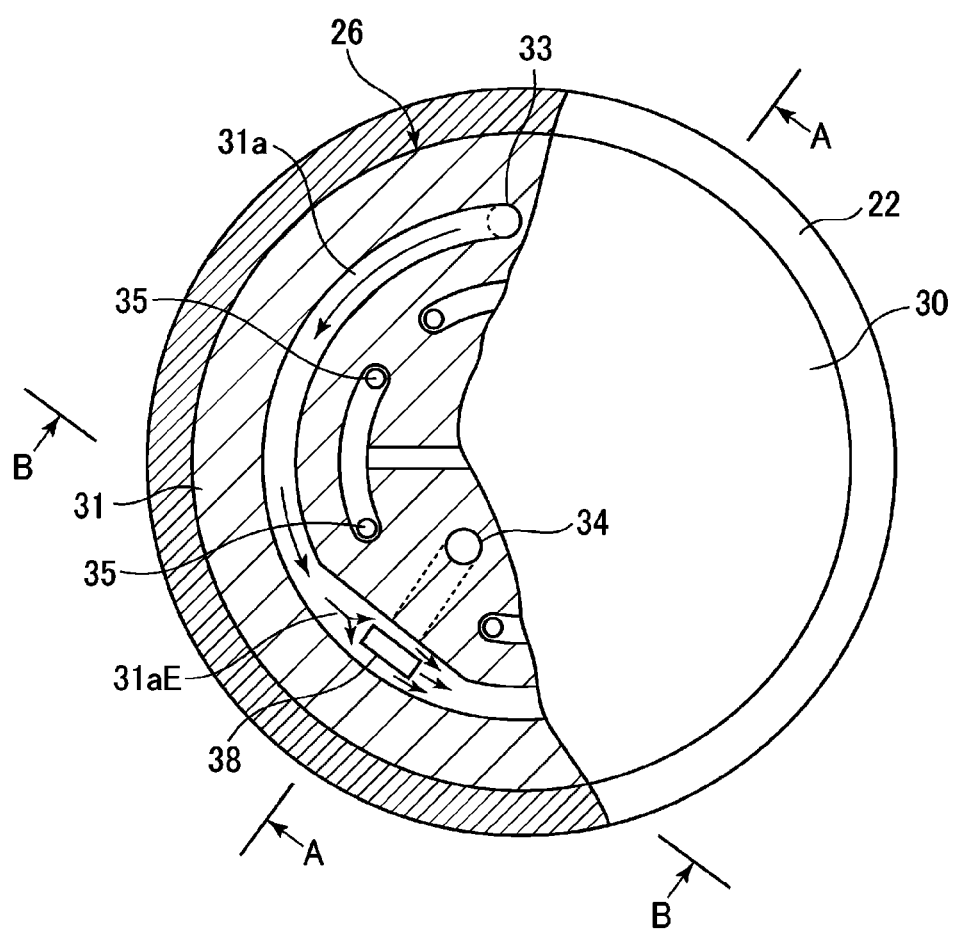
FIG. 6 is a partial cross-sectional view illustrating a portion of a shower head, which is a main part of an example of a gas treatment apparatus for carrying out the second embodiment.
Figure 7:
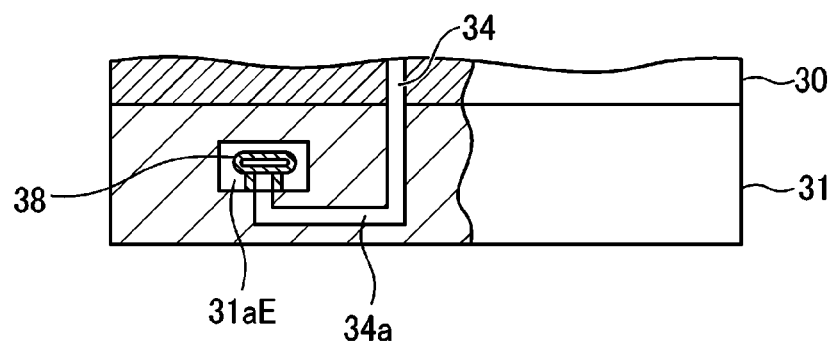
FIG. 7 is a cross-sectional view taken along line A-A in FIG. 6.
Figure 8:
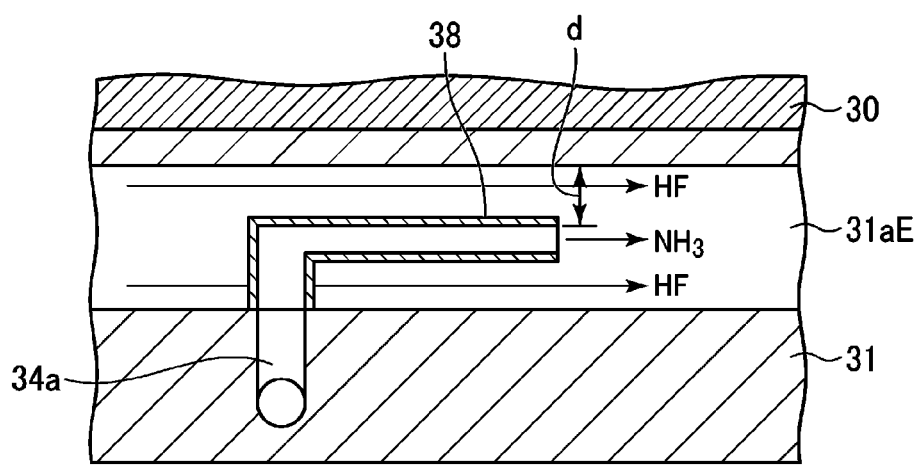
FIG. 8 is a cross-sectional view taken along line B-B in FIG. 6.

FIG. 5 is a cross-sectional view illustrating a gas treatment apparatus according to a second embodiment. FIG. 6 is a partial cross-sectional view illustrating a portion of a shower head, which is a main part of the gas treatment apparatus according to the second embodiment. FIG. 7 is a cross-sectional view taken along line A-A in FIG. 6. FIG. 8 is a cross-sectional view taken along line B-B in FIG. 6.

The basic configuration of the gas treatment apparatus 1' according to the present embodiment illustrated in FIG. 5 is the same as that of the gas treatment apparatus 1 of the first embodiment of FIG. 1 except that no resin coating is formed. Accordingly, in FIG. 5, the parts that are the same as those in FIG. 1 will be denoted by the same reference numerals, and a description thereof will be omitted.

The present embodiment is characterized by a merging portion of HF gas as a fluorine-containing gas and $NH_3$ gas as an alkaline gas in the gas flow path 31a of the intermediate plate 31. As illustrated in FIGS. 6 to 8, the gas flow path 31a of the intermediate plate 31 of the shower head 26 extends circumferentially from the connection portion of the first gas introduction hole 33, so that first, the fluorine-containing gas (HF gas) flows from the first gas introduction hole 33.

A merging portion 31aE is formed in the middle of the gas flow path 31a. The merging portion 31aE has a gas ejection member 38 configured to eject an alkaline gas ($NH_3$ gas) along the flow of the fluorine-containing gas in the gas flow path 31a, and the merging portion 31aE of the gas flow path 31a has a large diameter. A secondary gas flow path 34a extending from the second gas introduction hole 34 is connected to the gas ejection member 38. The secondary gas flow path 34a extends downward from the second gas introduction hole 34 to a position below the gas flow path 31a, further horizontally extends from that position toward the merging portion 31aE, and is connected upward to the bottom of the gas ejection member 38 at a position corresponding to the gas ejection member 38.

The gas flow path 31a further extends in a circumferential shape from the merging portion 31aE, so that the fluorine-containing gas (HF gas) and the alkaline gas ($NH_3$ gas) flow therethrough in the state of being mixed. The gas flow path 31a is branched into plural parts in a specific shape at a specific position after the merging portion 31aE, and connection holes 35 connected to a recess 32a serving as a gas diffusion space are provided at the end of the branching portion of the gas flow path 31a. As a result, the mixed gas of the fluorine-containing gas (HF gas) and the alkaline gas ($NH_3$ gas) reaches the recess 32a, which becomes a gas diffusion space, from the gas flow path 31a via the connection holes 35 and the gas injection plug 36, and is ejected from the gas ejection holes 37.

That is, the merging portion 31aE has a double structure having a gas ejection member 38 in the gas flow path 31a, and is configured such that the alkaline gas ($NH_3$ gas) is ejected from the gas ejection member 38 in the same direction as the flow of the fluorine-containing gas (HF gas) flowing through the gas flow path 31a. Therefore, the alkaline gas ($NH_3$ gas) flows along the flow of the fluorine-containing gas (HF gas) in the central portion of the flow of the fluorine-containing gas (HF gas) in the gas flow path 31a, and thus the alkaline gas ($NH_3$ gas) is suppressed from coming into contact with the wall at a high concentration.

As described above, in the case in which the shower head 26 is made of an aluminum-based material, when the alkaline gas ($NH_3$ gas) is simply introduced into the gas flow path 31a from the second gas introduction hole 34, the alkaline gas comes into contact with the wall made of the aluminum-based material at a high concentration in the merging region of these gases. Therefore, in the merging region, for example, the above-mentioned reactions of formulas (1) to (3) by HF gas as a fluorine-containing gas, $NH_3$ gas as an alkaline gas, Al, and water are likely to occur, and particles are likely to be generated.

In contrast, in the present embodiment, since the alkaline gas ($NH_3$ gas) is merged from the gas ejection member 38 along the flow of the fluorine-containing gas (HF gas) in the merging portion 31aE, the alkaline gas ($NH_3$ gas) is suppressed from coming into contact with the wall made of an aluminum-based material at a high concentration. Therefore, the above-mentioned reactions of formulas (1) to (3) are less likely to occur, and the generation of particles can be suppressed.

At this time, from the viewpoint of enhancing the effect of suppressing the generation of particles, the distance d (see FIG. 8) between the ejection flow of the alkaline gas ($NH_3$ gas) from the gas ejection member 38 and the wall of the gas flow path 31a is preferably set to 2.5 mm or more. Regarding the gas ratio, when the $NH_3$ gas ratio is $HF:NH_3=6.5:1$ or more, the above reactions are likely to occur in the merging portion or the like, and the configuration of the merging portion of the present embodiment becomes more effective.

Other Applications

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, in the first embodiment, the merging portion of the fluorine-containing gas and the alkaline gas may have a double-tube structure and may be configured such that the alkaline gas is ejected along the flow of the fluorine-containing gas. In addition, in the second embodiment, at least the inner surface of the gas flow path 31a may be coated with a resin. By doing so, both the effect of the resin coating and the effect of suppressing the contact of the alkaline gas with the wall of the gas flow path at a high concentration can be obtained, and the generation of particles can be more effectively suppressed. In this case, even if the film is worn and the aluminum-based material is exposed, the reactions in the merging portion can be suppressed, and the generation of particles can be effectively suppressed.

The gas treatment apparatuses of the above-described embodiments are merely examples, and gas treatment apparatuses having various configurations can be applied.

In the above-described embodiments, the etching of a silicon oxide-based material existing on the surface of a substrate is illustrated as gas treatment, but the present disclosure is not limited thereto and may be applicable to other treatment such as cleaning. Although a semiconductor wafer has been exemplified as a substrate, the substrate may be another substrate such as a flat panel display (FPD) substrate represented by a substrate for liquid crystal display (LCD) or a ceramic substrate without being limited to the semiconductor wafer.

According to the present disclosure, there is provided a gas treatment apparatus capable of suppressing the occurrence of defects in a substrate due to particles during gas treatment using a fluorine-containing gas and an alkaline gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas treatment apparatus for performing gas treatment on a substrate, the gas treatment apparatus comprising:
    a chamber in which the substrate is accommodated;
    a gas supply mechanism configured to individually supply a fluorine-containing gas and an alkaline gas; and
    a gas introduction member configured to cause the fluorine-containing gas and the alkaline gas supplied from the gas supply mechanism to merge with each other and introduce a mixed gas in which the fluorine-containing gas and the alkaline gas are mixed into the chamber,
    wherein the gas introduction member includes:
        a main body made of an aluminum-based material, the main body including a first plate in which a gas flow path is formed and a gas diffusion space into which the mixed gas is introduced from the gas flow path; and
        a first gas introducer and a second gas introducer connected to the gas flow path and configured to introduce the fluorine-containing gas and the alkaline gas from the gas supply mechanism to the gas flow path inside the main body, respectively,
    wherein the first plate is provided with a connection hole connecting the gas flow path and the gas diffusion space,
    wherein a gas injection plug made of a resin is installed to a portion of the first plate corresponding to the connection hole, and is configured to inject the mixed gas into the gas diffusion space,
    wherein the fluorine-containing gas and the alkaline gas respectively introduced by the first gas introducer and the second gas introducer first merge in the gas flow path to form the mixed gas in the gas flow path,
    wherein a portion of the gas introduction member including a merging point of the fluorine-containing gas and the alkaline gas is made of an aluminum-based material, and
    wherein a resin coating is formed on at least the connection hole and an inner surface of the gas flow path in which the fluorine-containing gas and the alkaline gas first merge and the mixed gas is formed, by powder coating or spray coating, and has a thickness in a range of 40 µm to 1.0 mm.

2. The gas treatment apparatus of claim 1, wherein the gas introduction member is a shower head configured to eject gas into the chamber in a shower form, and
    wherein the main body further includes a second plate including gas ejection holes configured to eject the mixed gas from the gas diffusion space into the chamber.

3. The gas treatment apparatus of claim 2, wherein the resin coating is also formed on an inner surface of the gas diffusion space.

4. The gas treatment apparatus of claim 1, wherein the gas injection plug is made of PFA which does not contain mica.

5. The gas treatment apparatus of claim 1, wherein the chamber is made of an aluminum-based material, and the resin coating is also formed on an inner surface of the chamber.

6. The gas treatment apparatus of claim 1, wherein the resin coating is made of PFA which does not contain mica.

7. The gas treatment apparatus of claim 1, wherein the fluorine-containing gas is at least one selected from HF gas, $F_2$ gas, $ClF_3$ gas, and $NF_3$ gas, and the alkaline gas is at least one selected from $NH_3$ gas and an amine gas.

* * * * *